United States Patent [19]

Abiko

[11] Patent Number: 5,677,233

[45] Date of Patent: Oct. 14, 1997

[54] PROCESS OF FABRICATING SEMICONDUCTOR DEVICE HAVING ISOLATING OXIDE RISING OUT OF GROOVE

[75] Inventor: Hitoshi Abiko, Tokyo, Japan

[73] Assignee: NEC Corporation, Tokyo, Japan

[21] Appl. No.: 772,518

[22] Filed: Dec. 24, 1996

[30] Foreign Application Priority Data

Dec. 25, 1995 [JP] Japan ................................. 7-336922

[51] Int. Cl.$^6$ ................................................. H01L 21/76
[52] U.S. Cl. ............................ 437/67; 437/63; 437/64; 148/DIG. 50
[58] Field of Search ............................. 437/69, 70, 72, 437/73, 67, 63, 64; 148/DIG. 50

[56] References Cited

U.S. PATENT DOCUMENTS

| | | | |
|---|---|---|---|
| 5,177,028 | 1/1993 | Manning | 148/DIG. 50 |
| 5,506,168 | 4/1996 | Morita et al. | 437/67 |
| 5,518,950 | 5/1996 | Ibok et al. | 437/67 |

OTHER PUBLICATIONS

T. Iizuka et al., "Double Threshold Mosfets in Bird's-Beak Free Structures", *IEDM 81*, 1981, pp. 380–383.

*Primary Examiner*—Trung Dang
*Attorney, Agent, or Firm*—Sughrue, Mion, Zinn, Macpeak & Seas, PLLC

[57] ABSTRACT

When an isolating oxide is formed in a silicon substrate, a side wall is formed on the inner wall of a mask consisting of a lower silicon oxide layer and an upper silicon nitride layer for forming a groove in the silicon substrate in such a manner as to be laterally spaced from the inner wall of the upper silicon nitride layer, and the isolating oxide is formed from a silicon oxide layer deposited over the mask after removal of the side wall by using a polishing, thereby preventing the isolating oxide from undesirable side etching during an etching step for the lower silicon oxide layer.

9 Claims, 11 Drawing Sheets

1

PROCESS OF FABRICATING SEMICONDUCTOR DEVICE HAVING ISOLATING OXIDE RISING OUT OF GROOVE

FIELD OF THE INVENTION

This invention relates to a process of fabricating a semiconductor device and, more particularly, to a process of fabricating a semiconductor device having an isolating oxide rising out of a groove.

DESCRIPTION OF THE RELATED ART

Various circuit components are integrated on a semiconductor substrate, and form an integrated circuit through conductive wirings for providing signal paths therebetween. An appropriate electrical isolation is required between the circuit components to prevent the integrated circuit from malfunction. One of the electrically isolating structure is an isolating oxide swelling out from a groove formed in a semiconductor substrate.

A typical example of the process of fabricating a semiconductor device isolated with the isolating oxide is illustrated in FIGS. 1A to 1H of the drawings. The prior art process starts with preparation of a silicon substrate 1. Silicon oxide is grown on the major surface of the silicon substrate 1, and, accordingly, the major surface of the silicon substrate 1 is covered with a silicon oxide layer 2a. Thereafter, silicon nitride is deposited over the entire surface of the silicon oxide layer 2a, and forms a silicon nitride layer 2b on the silicon oxide layer 2a. Thus, the silicon oxide layer 2a and the silicon nitride layer 2b are laminated on the major surface of the silicon substrate 1, and the silicon substrate 1, the silicon oxide layer 2a and the silicon nitride layer 2b as a whole constitute a multilayer structure 4.

Subsequently, photo-resist solution is spun onto the silicon nitride layer 2b, and is baked so as to form a photo-resist layer on the silicon nitride layer 2b. A pattern image for an isolation oxide is optically transferred to the photo-resist layer, and a latent image is formed in the photo-resist layer. The latent image is developed in developing solution, and the photo-resist layer is patterned into a photo-resist mask 3.

Using the photo-resist mask 3, the silicon nitride layer 2b, the silicon oxide layer 2a and the silicon substrate 1 are successively etched away, and a groove 4a is formed in the multilayer structure 4 as shown in FIG. 1A.

The photo-resist mask 3 is stripped off, and silicon oxide is deposited over the entire surface of the multilayer structure 4 by using a low pressure chemical vapor deposition. The silicon oxide fills the groove 4a, and the entire surface of the multilayer structure 4 is topographically covered with a silicon oxide layer 5 as shown in FIG. 1B.

Subsequently, the silicon oxide layer 5 is polished until the silicon nitride layer 2b is exposed, and a silicon oxide layer 5a is left in the groove 4a. Then, the upper surface of the silicon nitride 2b is coplanar with the upper surface of the silicon oxide layer 5a, and a flat surface is created over the silicon nitride layer 2b and the silicon oxide layer 5a as shown in FIG. 1C.

Using the silicon nitride layer 2b as an etching mask, hydrogen fluoride partially etches the silicon oxide layer 5a until the upper surface of the silicon oxide layer 5a becomes coplanar with the upper surface of the silicon oxide layer 2a as shown in FIG. 1D. Although it is difficult to make the upper surface of the silicon oxide layer 5a strictly coplanar with the upper surface of the silicon oxide layer 2a, the silicon oxide layer 5a becomes roughly coplanar with the silicon oxide layer 2a through the etching.

Subsequently, the silicon nitride layer 2b is etched away by using hot phosphoric acid at 150 degrees in centigrade. The silicon oxide layer 5a defines active areas 1a and 1b on both side thereof, and the active areas 1a and 1b are assumed to be assigned to field effect transistors, respectively.

Photo-resist solution is spun onto the silicon oxide layers 2a and 5a, and is baked so as to form a photo-resist layer. A pattern image for channel regions is optically transferred to the photo-resist layer, and a latent image is formed in the photo-resist layer. The latent image is developed, and a photo-resist mask 6 is formed on the silicon oxide layers 2a and 5a.

Using the photo-resist mask 6, an ion-implantation is carried out for a channel doping. The photo-resist mask 6 exposes channel regions to do the dopant impurity as shown in FIG. 1E, and a predetermined impurity profile is created in the channel regions.

The photo-resist mask 6 is stripped off, and the lithographic process is repeated for a photo-resist mask 7 shown in FIG. 1F. The photo-resist mask 7 exposes the silicon oxide layer 2a to the hydrogen fluoride until the silicon substrate 1 appears. The silicon oxide layer 2a is etched away as shown in FIG. 1G, and the active areas 1a and 1b are exposed, again. The amount of silicon oxide to be etched is depending upon time for exposing it to the etchant, and the time is determined from the thickness of the silicon oxide layer 2a, fluctuation of deposition rate of the silicon oxide, the etching rate and a fluctuation of etching rate. After the etching, the photo-resist mask 7 is stripped off, and the silicon oxide layer 5a remains in the silicon substrate 1. The silicon oxide layer 5a serves as an isolating oxide.

The exposed surface portions of the active areas 1a/1b are thermally oxidized, and thin gate oxide layers 8a/8b are grown on the active areas 1a and 1b. Polysilicon is deposited over the entire surface of the resultant structure, and a photo-resist mask (not shown) is provided on the polysilicon layer through the lithographic process. The polysilicon layer is patterned into a common gate electrode 8c extending over the channel regions and the isolating oxide 5a as shown in FIG. 1H. Finally, dopant impurity is ion implanted into the active areas 1a and 1b in a self-aligned manner with the common gate electrode 8c. The ion-implanted dopant impurity forms source and drain regions, and the field effect transistors are completed. The isolating oxide 5a electrically isolates the field effect transistors from each other, and prevents the field effect transistors from malfunction.

However, the prior art process encounters a problem in that a large amount of leakage current flows through the channel regions.

SUMMARY OF THE INVENTION

It is therefore an important object of the present invention to provide a process of fabricating a semiconductor device which reduces the leakage current of a transistor.

The present inventor contemplated the problem, and noticed that an over-etching tended to take place during the etching stage of the silicon oxide layer 2a. This was because of the fact that the etching time was prolonged due to the fluctuation of etching rate. The etchant penetrates into the outer periphery of the silicon oxide layer 5a, and forms steps 9a/9b at the boundaries between the silicon substrate 1 and the silicon oxide layer 5a as encircled in FIG. 2.

The steps 9a/9b were covered with the gate oxide layers 8a/8b, and the common gate electrode 8c topographically extended over the steps 9a/9b as shown in FIG. 3. The common gate electrode 8c created not only a vertical electric field 10a but also a horizontal electric field 10b at the steps 9a/9b, and decreased the threshold of the field effect transistors. The field effect transistor was equivalent to the combination of a standard field effect transistor represented by plots PL1 and a low-threshold field effect transistor represented by plots PL2 (see FIG. 4), and the drain current X1 at the gate potential of zero was observed as the leakage current.

The present inventor concluded that if the steps 9a/9b were not formed in the periphery of the oxide layer 5a, the leakage current would be restricted.

To accomplish the object, the present invention proposes to cause a silicon oxide layer to swell out from a groove before forming a gate insulating layer.

In accordance with the present invention, there is provided a process of fabricating a semiconductor device, comprising the steps of: a) preparing a substrate of a semiconductor material having a major surface and covered with a first insulating layer of an insulating material; b) providing a first mask of a first material formed on the first insulating layer and defining a first window over a first areas of the major surface; c) providing a second mask of a second material formed over a second area of the major surface nested in the first area and defining a second window over a third area of the major surface nested in the second area; d) forming a groove in the substrate by using the first and second masks; e) etching the second mask by using a first etchant having a selectivity between the first material and the second material so as to expose a fourth area of the major surface between an outer periphery of the first area and the groove; f) depositing the insulating material over the resultant structure of the step e) so that the insulating material swells into a second insulating material layer over the first mask; g) polishing the second insulating material layer and the first mask so as to create a flat surface extending over the second insulating material layer and the first mask; h) etching a remaining portion of the first mask by using a second etchant having a selectivity between the first material and the insulating material; and i) etching the first insulating layer so that the second insulating layer has an outer peripheral edge portion on the major surface.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

FIGS. 5A to 5L illustrate a process of fabricating a semiconductor device embodying the present invention. The process starts with preparation of a single crystal silicon substrate 11. Silicon oxide is deposited to 10 nanometers thick on the major surface of the single crystal silicon substrate 11, and forms a silicon oxide layer 12a on the major surface. Thereafter, silicon nitride is deposited to 100 nanometers thick over the silicon oxide layer 12a, and a silicon nitride layer 12b is laminated on the silicon oxide layer 12a.

Figure 1:
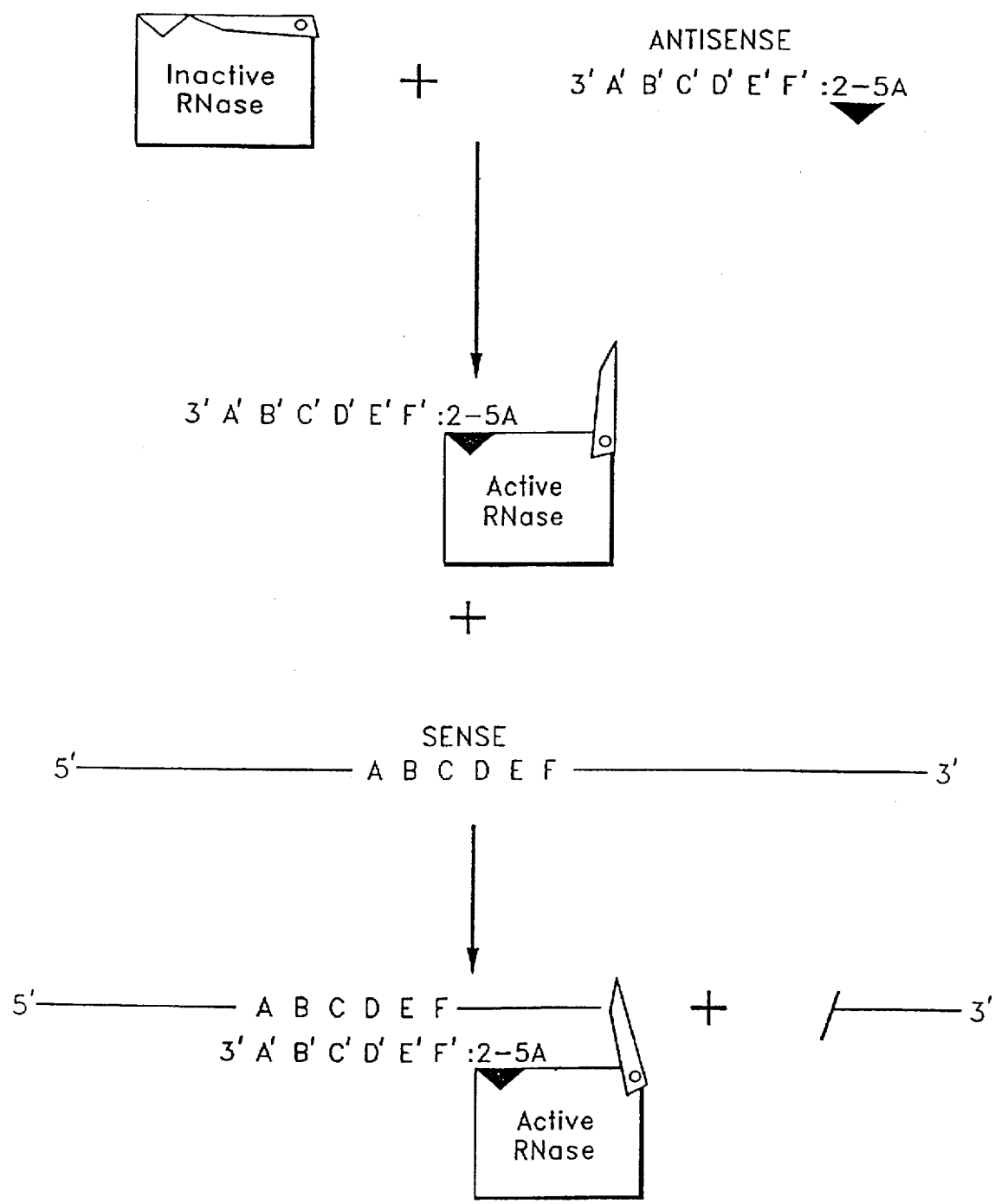
FIGS. 1A to 1H are cross sectional views showing the prior art process of fabricating a semiconductor device.
Figure 1C:
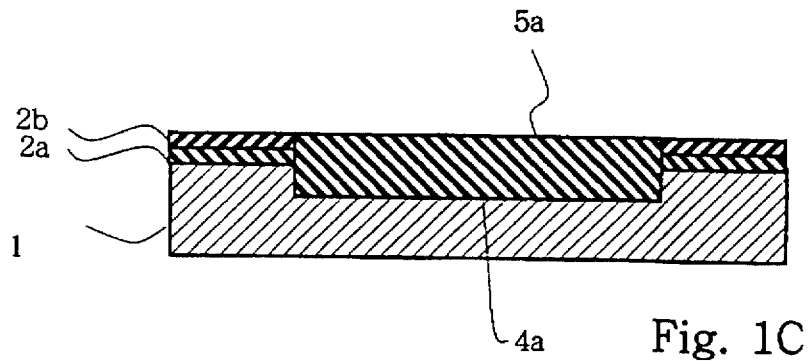
Figure 1D:
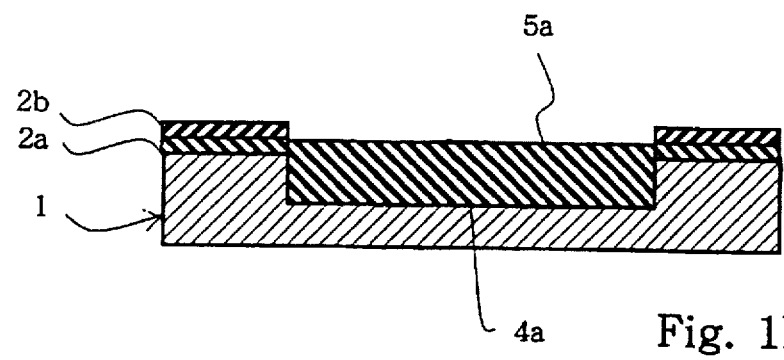
Figure 1E:
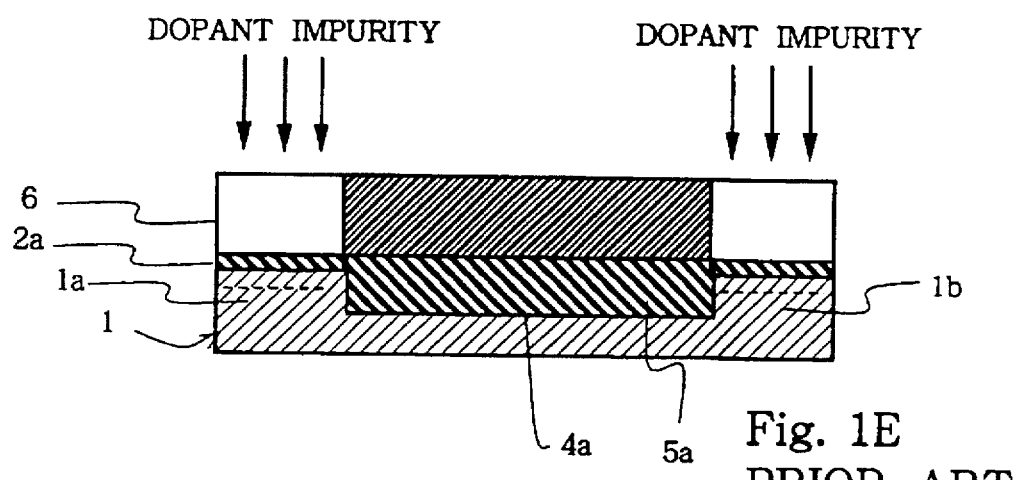
Figure 1F:
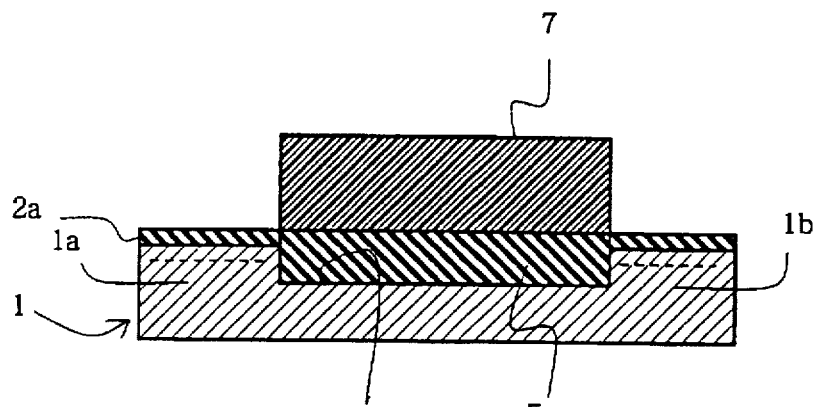
Figure 1G:
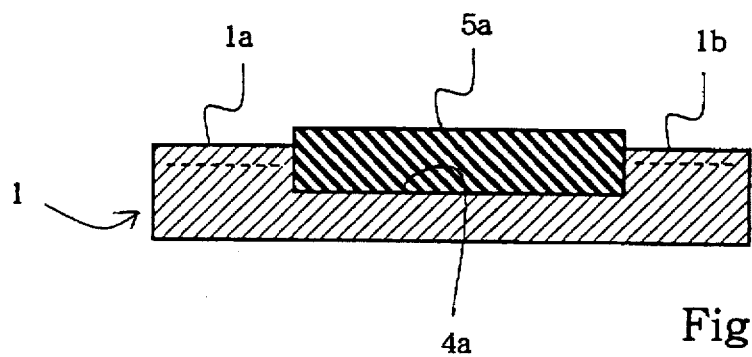
Figure 1H:
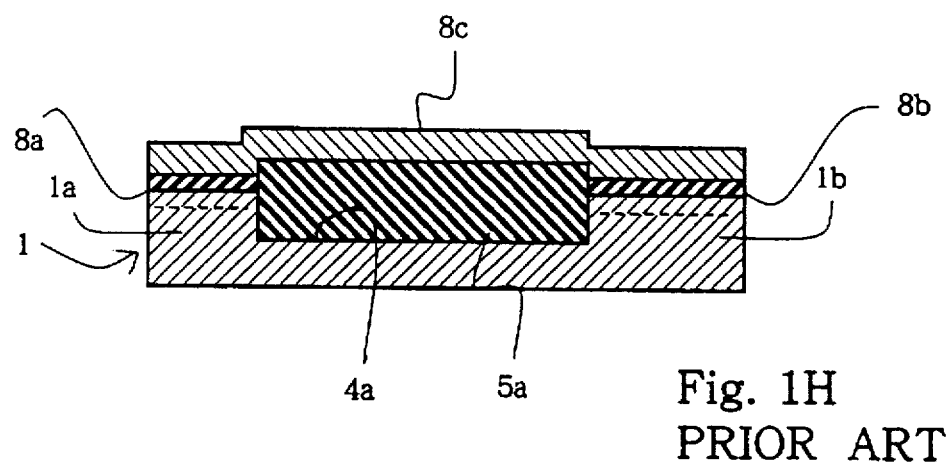
Figure 2:
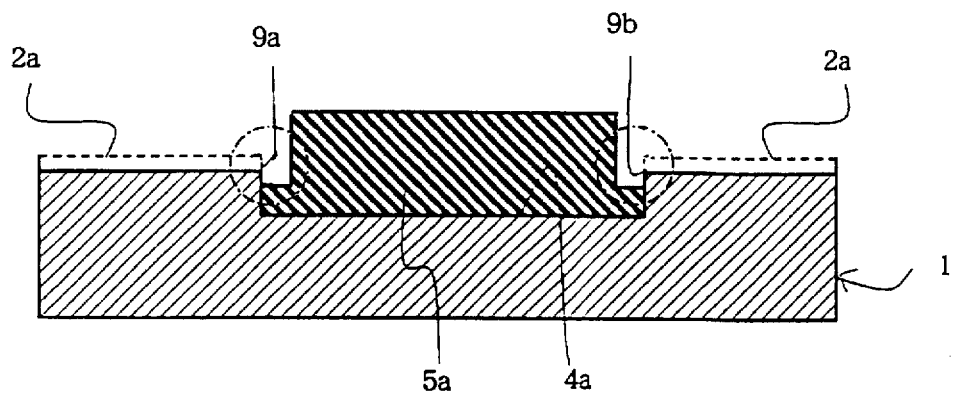
FIG. 2 is a cross sectional view showing the structure of an intermediate structure after the etching stage for the silicon oxide layer.
Figure 3:
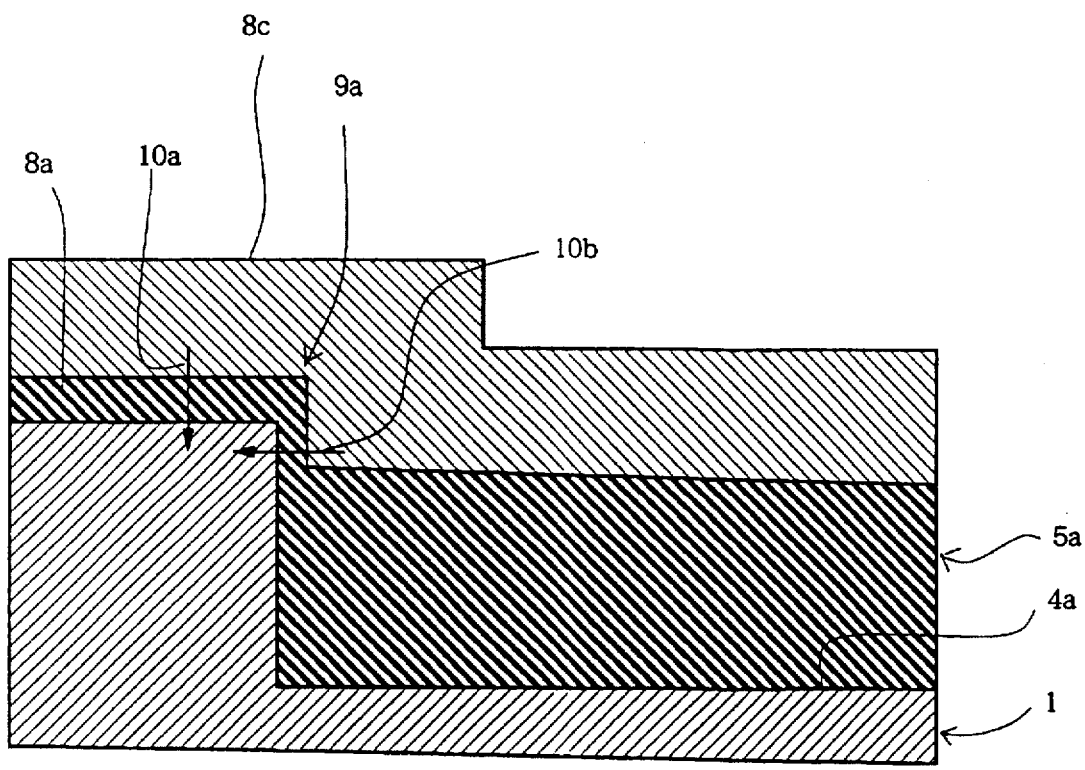
FIG. 3 is a cross sectional view showing the boundary between the isolating oxide and the silicon substrate.
Figure 4:
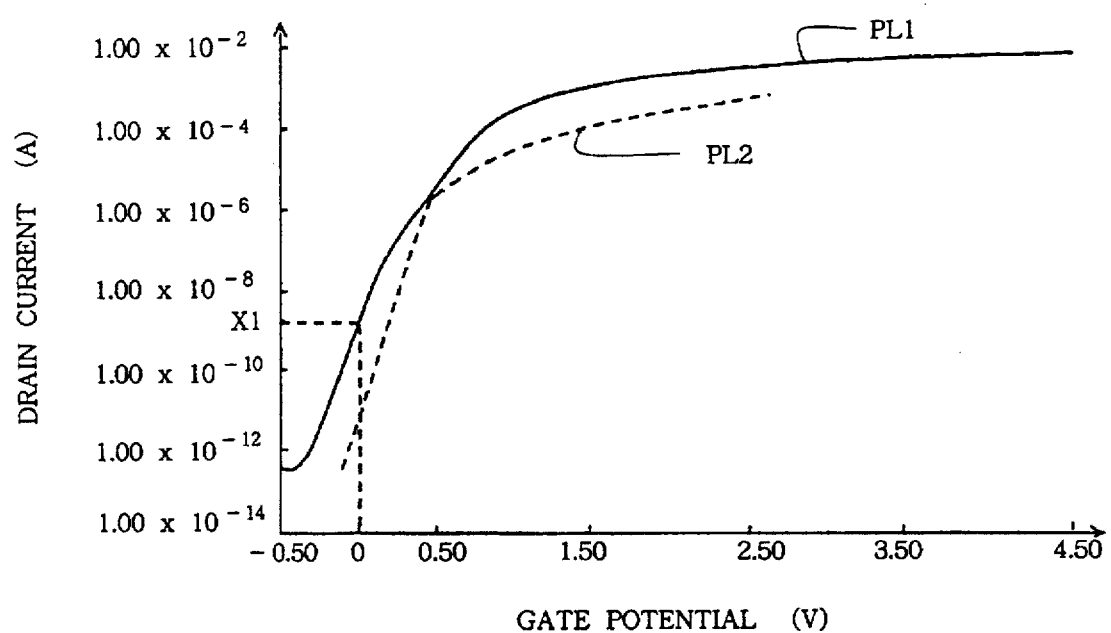
FIG. 4 is a graph showing the gate potential-to-drain current characteristics of the field effect transistor fabricated through the prior art process.
Figure 5A:
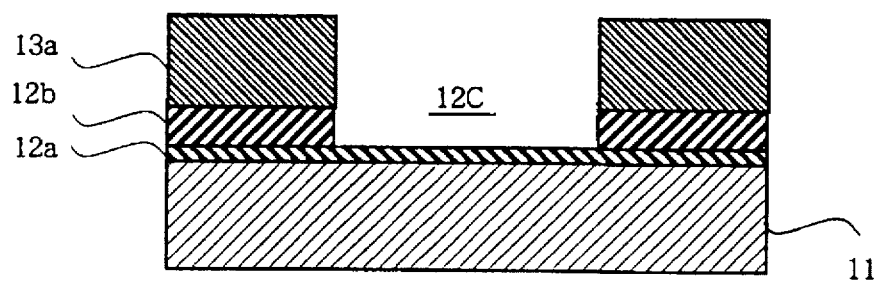
FIGS. 5A to 5L are cross sectional views showing a process sequence for fabricating a semiconductor device according to the present invention.

Photo-resist solution is spun onto the entire surface of the silicon nitride layer 12b, and is baked so as to form a photo-resist layer on the silicon nitride layer 12b. A pattern image for a window is optically transferred to the photo-resist layer, and a latent image is formed in the photo-resist layer. The latent image is developed so that a photo-resist etching mask 13a is provided on the silicon nitride layer 12b. Using the photo-resist etching mask 13a, the silicon nitride layer 12b is anisotropically etched away, and a window 12c is formed in the silicon nitride layer 12b as shown in FIG. 5A. A part of the silicon oxide layer 12a is exposed to the window 12c. The silicon oxide layer 12a may be partially etched away during the anisotropic etching. However, the major surface of the single crystal silicon substrate 11 is still covered with the silicon oxide layer 12a, and the remaining silicon oxide layer 12a prevents the single crystal silicon substrate 11 from damage due to the anisotropic etching.

Figure 5B:
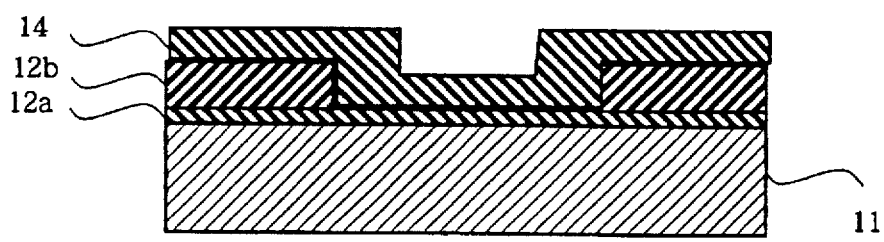

The photo-resist etching mask 13a is stripped off, and silicon oxide is deposited over the entire surface of the resultant structure by using a low pressure chemical vapor deposition. A good step coverage is achieved by the low pressure chemical vapor deposition. As a result, a silicon oxide layer 14 topographically extends over the exposed surfaces of the silicon oxide layer 12a and the silicon nitride layer 12b as shown in FIG. 5B. The silicon oxide layer 14 is equal in thickness to or greater than the silicon oxide layer 12a, and is 15 nanometers thick in this instance.

Figure 5C:
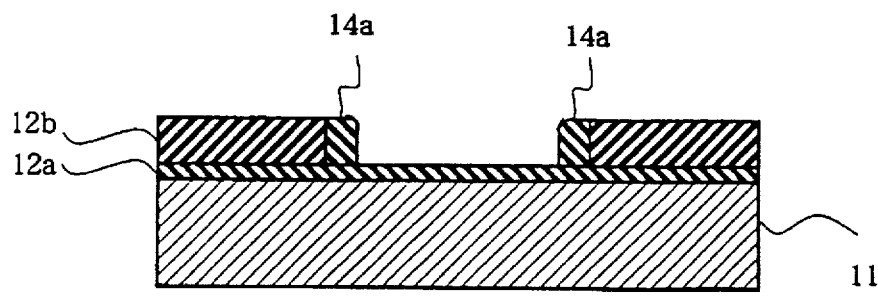

The silicon oxide layer 14 is anisotropically etched without an etching mask, and a side wall 14b is formed on the inner surface of the silicon nitride layer 12b as shown in FIG. 5C. The width of the side wall 14b is equal to or greater than the thickness of the silicon oxide layer 12a, and is 15 nanometers in this instance.

Figure 5D:
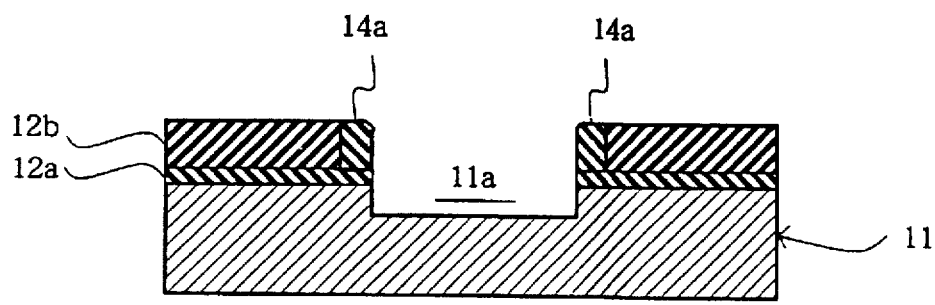

Using the silicon nitride layer 12b and the side wall 14a as an etching mask, the silicon oxide layer 12a and the single crystal silicon substrate 11 are anisotropically etched away, and a groove 11a is formed in the single crystal silicon substrate 11 as shown in FIG. 5D. In this instance, the groove 11a is 20 nanometers in depth with respect to the major surface of the single crystal silicon substrate 11.

Figure 5E:
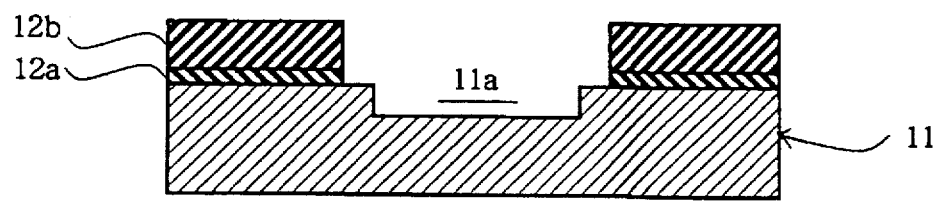

Subsequently, the side wall 14a is etched away by using hydrogen fluoride as shown in FIG. 5E. While the side wall 14a is being etched, the hydrogen fluoride attacks the silicon oxide layer 12a, and concurrently etches away a surface portion of the silicon oxide layer 12a. However, the etching on the silicon oxide layer 12a is not a serious problem in so far as the silicon nitride layer 12b does not peel off. The removal of the side wall 14a may be carried out in a later stage.

Figure 5F:
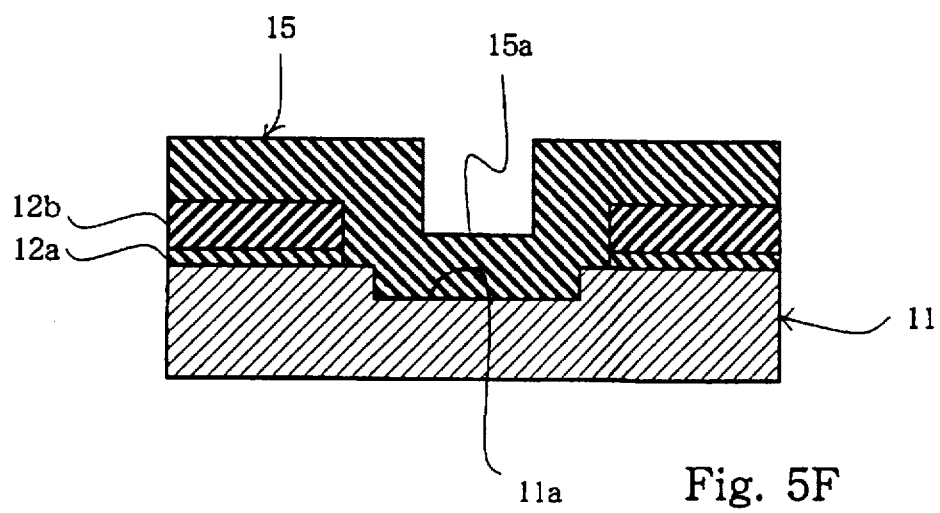

Silicon oxide is deposited to 120 nanometers thick over the entire surface of the resultant structure shown in FIG. 5E by using the low pressure chemical vapor deposition, and a silicon oxide layer 15 is topographically formed on the resultant structure as shown in FIG. 5F. It is necessary for the silicon oxide layer 15 to have the thickness greater than the depth of the groove measured from the upper surface of the silicon oxide layer 12a. The silicon oxide layer 15 fills the groove, and the lowest top surface 15a of the silicon oxide layer 15 is between the top surface of the silicon oxide layer 12a and the top surface of the silicon nitride layer 12b.

Figure 5G:
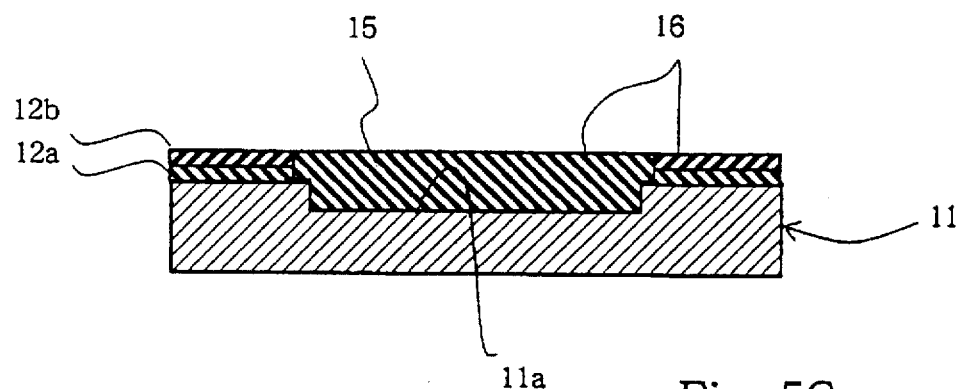

The silicon oxide layer 15 and the silicon nitride layer 12b are polished until a flat surface 16 is created over the silicon nitride layer 12b and the silicon oxide layer 15 as shown in FIG. 5G. In this instance, the flat top surface 16 is 110 nanometers in height from the bottom surface of the groove 11a.

Figure 5H:
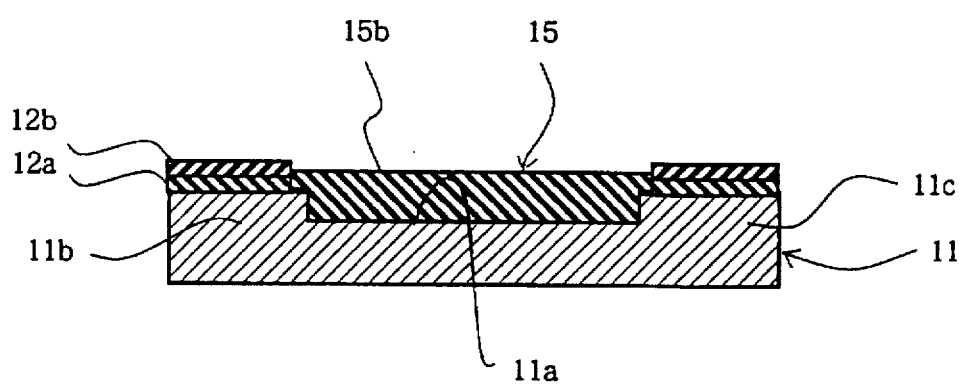

Subsequently, using the silicon nitride 12b as an etching mask, hydrogen fluoride selectively etches the silicon oxide layer 15, and the etching depresses the silicon oxide layer 15 into the groove 11a as shown in FIG. 5H. The silicon oxide layer 15 defines active areas 11b and 11c on both sides thereof.

The top surface 15b of the silicon oxide layer 15 is between the upper surface of the silicon oxide layer 12a and the top surface of the silicon nitride layer 12b. Although the silicon oxide layer 15 is required to have the top surface 15b higher than the upper surface of the silicon oxide layer 12a, it is desirable that the top surface 15b is as close to the upper surface of the silicon oxide layer 12a as possible in view of electric properties of semiconductor. In this instance, the top surface 15b is 30 nanometers in height from the major surface of the silicon substrate 11. However, if the silicon nitride layer 12b and the silicon oxide layer 15 have been already polished to have the top surface 15b 30 nanometers higher than the major surface of the silicon substrate 11, the selective etching stage on the silicon oxide layer 15 may be deleted from the process according to the present invention.

Figure 5I:
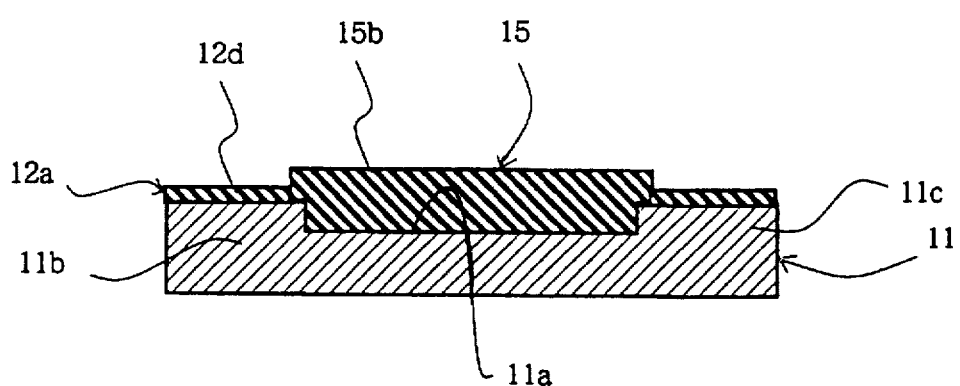

Subsequently, the silicon nitride layer 12b is etched away by using hot phosphoric acid. In this instance, the phosphoric acid is heated around 150 degrees in centigrade. As a result, the silicon oxide layer 12a appears, and the top surface 15b of the silicon oxide layer 15 is higher than the upper surface 12d of the silicon oxide layer 12a by 20 nanometers as shown in FIG. 5I.

Figure 5J:
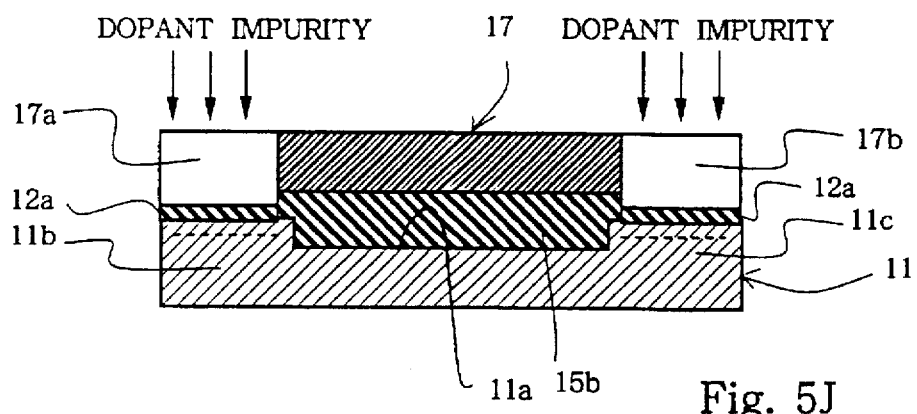

A photo-resist mask 17 is provided on the silicon oxide layer 15 through the lithographic process, and channel regions are exposed to windows 17a and 17b formed in the photo-resist mask 17. A dopant impurity is ion implanted through the windows 17a/17b into the channel regions of the active areas 11b/11c as shown in FIG. 5J, and forms an appropriate impurity profile in the channel regions. In this instance, boron is firstly ion implanted at dose of $4 \times 10^{12}$ cm$^{-2}$ under the acceleration energy of 100 KeV, and, thereafter, the boron is ion implanted at dose of $6 \times 10^{12}$ cm$^{-2}$ under the acceleration energy of 40 KeV. The impurity profile in the channel regions is depending upon the transistor characteristics to be expected.

Figure 5K:
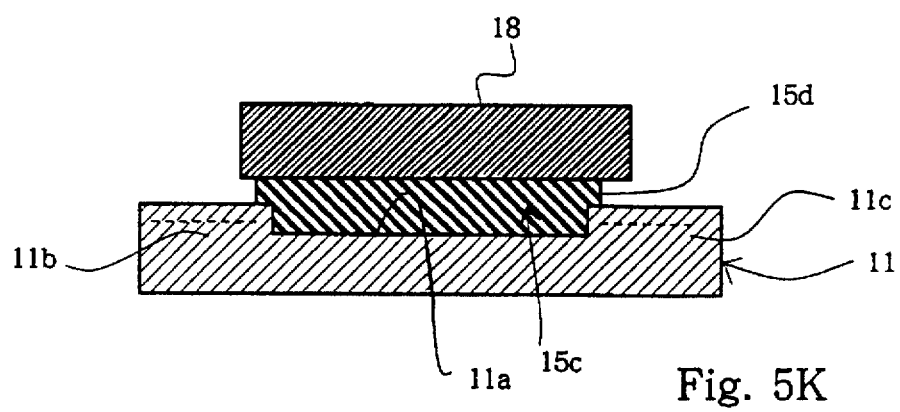

The photo-resist mask 17 is stripped off, and another photo-resist mask 18 is provided through the lithographic process. The photo-resist mask 17 exposes the silicon oxide layer 12a to the hydrogen fluoride, and the silicon oxide layer 12a is etched away. Time period for the etching is regulated in such a manner that the hydrogen fluoride etches the silicon oxide layer by 11 nanometers thick, because the silicon oxide layer 12a may be thicker than the design thickness of 10 nanometers. For this reason, the etching laterally proceeds, and the silicon oxide layer 15b is retracted by 11 nanometers. However, the outer peripheral edge 15d of the silicon oxide layer 15c is still on the major surface of the silicon substrate 11 as shown in FIG. 5K. In this instance, the distance between the outer peripheral edge 15d and the groove 11a is about 4 nanometers. The silicon oxide layer 15c serves as an isolating oxide, and the isolating oxide is labeled with the same reference as the silicon oxide layer 15c in the following description.

The outer peripheral edge portion on the major surface effectively prevents the silicon oxide layer 15b from undesirable steps. The distance between the outer peripheral edge 15d to the groove 11a is determined by the difference between the thickness of the silicon oxide layer 12a and the width of the side wall 14a, and the width of the side wall 14a is depending upon the thickness of the silicon oxide layer 14. For this reason, it is necessary for the silicon oxide layer 14 to have the thickness equal to or greater than the thickness of the silicon oxide layer 12a.

Figure 5L:
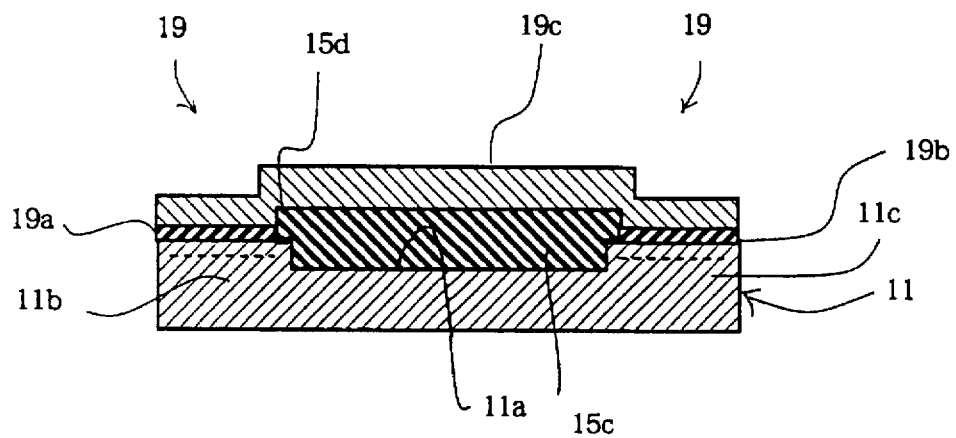

The photo-resist mask 18 is stripped off, and the active areas 11b and 11c are exposed again. The active areas 11b and 11c are thermally oxidized so as to form gate insulating layers 19a and 19b. Polysilicon is deposited over the entire surface of the resultant structure, and an appropriate photo-resist mask (not shown) is provided through the lithographic process. The gate oxide layers 19a/19b over the channel regions are overlain by photo-resist mask, and the polysilicon layer is patterned into a common gate electrode 19c as shown in FIG. 5L.

Dopant impurity is ion implanted into the active areas in a self-aligned manner with the common gate electrode 19c, and forms source and drain regions in the active areas on both sides of the channel regions. The channel regions, the source and drain regions, the gate insulating layer 19a/19b and the common gate electrode 19c form in combination a field effect transistor 19, and two field effect transistors are fabricated on both sides of the isolating oxide 15c.

The isolating oxide 15c still puts the outer peripheral edge 15d on the major surface of the silicon substrate 11, and is never depressed into the groove 11a. The common gate electrode 19c creates electric fields in the vertical direction to the major surface of the silicon substrate 11, and undesirable parasitic field effect transistor does not take place.

Figure 6:
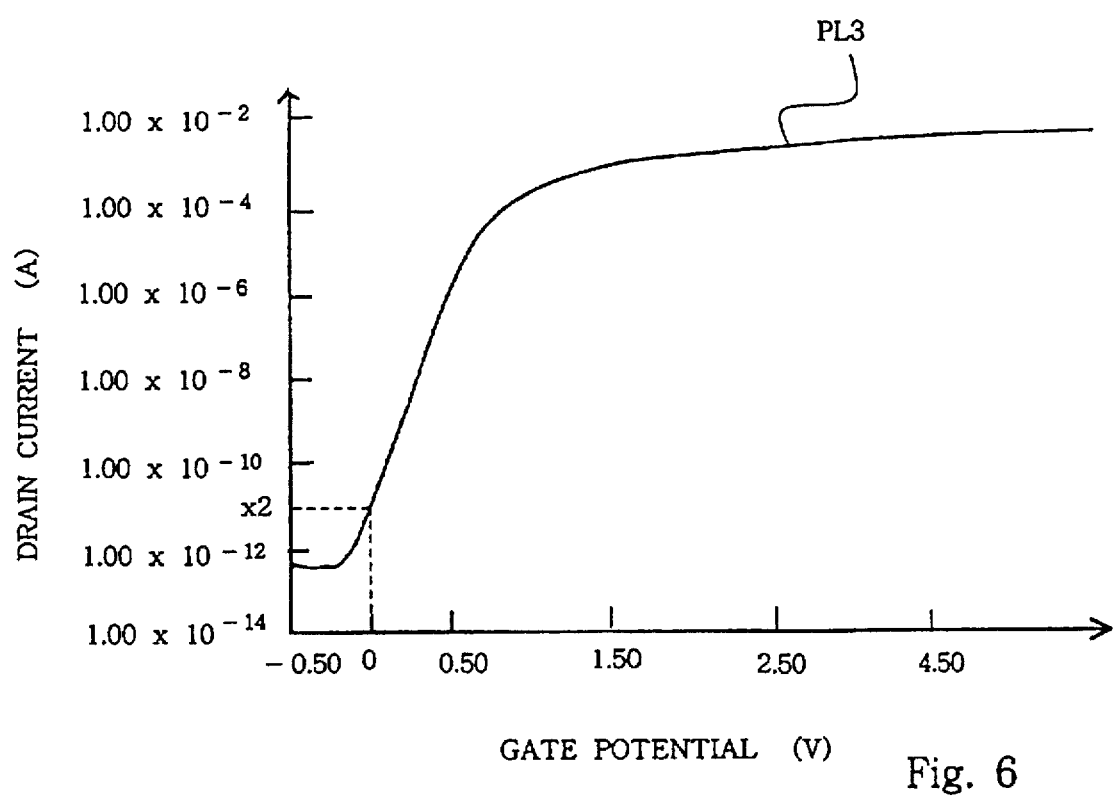
FIG. 6 is a graph showing the gate potential-to-drain current characteristics of a field effect transistor incorporated in the semiconductor device.

The present inventor evaluated the field effect transistors 19. The present inventor changed the potential level at the common gate electrode 19c, and measured the drain current. The gate potential-to-drain current characteristics were plotted in FIG. 6, and were represented by plots PL3. The drain current at the gate potential of zero was leakage current, and was reduced by two orders of magnitude.

As will be appreciated from the foregoing description, the isolating oxide 15c swells out from the groove 11a, and the outer peripheral edge portion on the major surface is effective against the undesirable steps. The isolating oxide 15c without a step at the periphery of the groove surely reduces the leakage current.

In the first embodiment, the side wall 14a causes the silicon oxide layer 15 to have the outer peripheral edge portion, and the silicon nitride layer 12b and the side wall 14a serve as a first mask and a second mask, respectively.

Second Embodiment

Figure 7A:
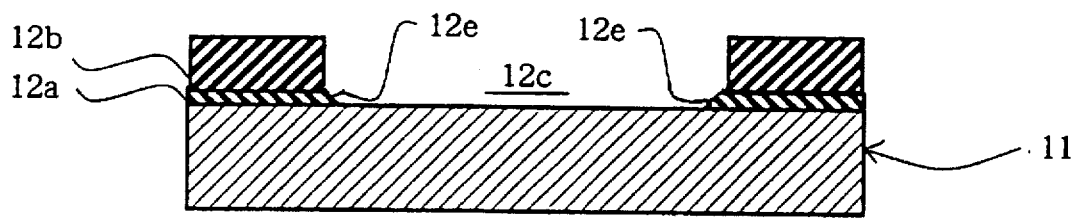
FIGS. 7A and 7B are cross sectional views essential stages of another process sequence according to the present invention.
Figure 7B:
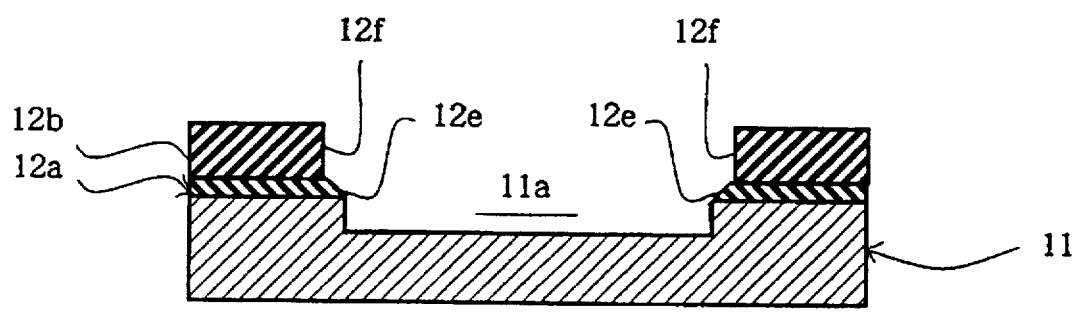

FIGS. 7A and 7B illustrate essential steps of another process sequence embodying the present invention. After the formation of the window 12c in the silicon oxide layer 12a and the silicon nitride layer 12b (see FIG. 5A), an inner end portion of the silicon oxide layer 12a is, by way of example, exposed by removing an inner end portion of the silicon nitride layer 12b, and an anisotropic etching is carried out under the conditions that a carbon-containing film becomes much in the inner edge of the silicon oxide layer 12a. Then, a tapered portion 12e is formed at the inner edge portions of the silicon oxide layer 12a as shown in FIG. 7A.

Using the silicon nitride layer 12b and the tapered portion 12e as an etching mask, the silicon substrate 11 is partially removed so as to form the groove 11a as shown in FIG. 7B. The tapered portion 12e spaces the groove 11a from the inner edge 12f of the silicon nitride layer 12b.

The process sequence proceeds to the step shown in FIG. 5F, and traces the sequence shown in FIGS. 5F to 5L. After the formation of the structure shown in FIG. 7B, the process implementing the second embodiment is similar to that of the first embodiment, and no further description is incorporated hereinbelow for avoiding repetition.

Although particular embodiments of the present invention have been shown and described, it will be obvious to those skilled in the art that various changes and modifications may be made without departing from the spirit and scope of the present invention.

For example, the silicon nitride layer 12b may be replaced with suitable material selective to the silicon oxide in the etching stage and withstanding the polishing, and such a alternative material is, by way of example, a thin diamond film. The silicon oxide layer 15 may be also replaced with suitable material selective to the silicon nitride in the etching stage, and polysilicon is an example of the material.

The active areas 11a and 11b may be assigned to a bipolar transistor or other circuit components such as a capacitor.

What is claimed is:

1. A process of fabricating a semiconductor device, comprising the steps of:
   a) preparing a substrate of a semiconductor material having a major surface and covered with a first insulating layer of an insulating material;
   b) providing a first mask of a first material formed on said first insulating layer and defining a first window over a first areas of said major surface;
   c) providing a second mask of a second material formed over a second area of said major surface nested in said first area and defining a second window over a third area of said major surface nested in said second area;
   d) forming a groove in said substrate by using said first and second masks;
   e) etching said second mask by using a first etchant having a selectivity between said first material and said second material so as to expose a fourth area of said major surface between an outer periphery of said first area and said groove;
   f) depositing said insulating material over the resultant structure of said step e) so that said insulating material swells into a second insulating material layer over said first mask;
   g) polishing said second insulating material layer and said first mask so as to create a flat surface extending over said second insulating material layer and said first mask;
   h) etching a remaining portion of said first mask by using a second etchant having a selectivity between said first material and said insulating material; and
   i) etching said first insulating layer so that said second insulating layer has an outer peripheral edge portion on said major surface.

2. The process as set forth in claim 1, in which said step c) includes the sub-steps of
   c-1) depositing said second material over the entire surface of the resultant structure of said step b) so as to cover said first mask and surfaces defining said first window with a layer of said second material, and
   c-2) anisotropically etching said layer of said second material by using a third etchant having a selectivity between said first material and said second material until said first mask appears, thereby forming a side wall serving as said second mask.

3. The process as set forth in claim 2, in which said first material, said insulating material and said second material are silicon nitride, silicon oxide and silicon oxide, respectively.

4. The process as set forth in claim 1, in which said step c) includes the sub-steps of
   c-1) removing an inner end portion of said first mask so as to expose an inner end portion of said first insulating layer; and
   c-2) forming said inner end portion of said first insulating layer into a tapered portion.

5. The process as set forth in claim 4, in which said first material, said insulating material and said second material are silicon nitride, silicon oxide and silicon oxide, respectively.

6. The process as set forth in claim 1, further comprising the step of etching said second insulating layer so as to create an upper surface thereof between the upper surface of said first insulating material layer and the upper surface of said first mask between said step g) and said step h).

7. The process as set forth in claim 6, further comprising the step of introducing a dopant impurity through said second insulating layer into a fifth area of said major surface between said step h) and said step i).

8. The process as set forth in claim 7, further comprising the step of j) forming a gate insulating layer on said fifth area of said major surface after said step i).

9. The process as set forth in claim 8, further comprising the step of k) forming a gate electrode on said gate insulating layer.

* * * * *

UNITED STATES PATENT AND TRADEMARK OFFICE
CERTIFICATE OF CORRECTION

PATENT NO. :5,677,233
DATED :October 14, 1997
INVENTOR(S) : Hitoshi Abiko

It is certified that error appears in the above-identified patent and that said Letters Patent is hereby corrected as shown below:

On the title page, under U. S. Patent Documents item [56], insert the followings:

-- 5,521,422   5/96    Mandelman, et al
   5,118,382   6/92    Cronin, et al
   4,534,824   8/85    Chen
   4,561,172   12/85   Slawinski, et al Foreign Patent Documents 02-271,620    11/90    Japan --

Signed and Sealed this

Twenty-sixth Day of May, 1998

*Attest:*

BRUCE LEHMAN

*Attesting Officer*       *Commissioner of Patents and Trademarks*